United States Patent [19]

Rakuljic et al.

[11] Patent Number: 5,491,570
[45] Date of Patent: Feb. 13, 1996

[54] METHODS AND DEVICES FOR USING PHOTOREFRACTIVE MATERIALS AT INFRARED WAVELENGTHS

[75] Inventors: George A. Rakuljic, Santa Monica; Victor Leyva, Los Angeles, both of Calif.

[73] Assignee: Accuwave Corporation, Santa Monica, Calif.

[21] Appl. No.: 991,571

[22] Filed: Dec. 16, 1992

Related U.S. Application Data

[63] Continuation-in-part of Ser. No. 965,746, Oct. 23, 1992, Pat. No. 5,335,098, which is a continuation-in-part of Ser. No. 908,298, Jul. 2, 1992, which is a continuation-in-part of Ser. No. 736,736, Jul. 26, 1991, abandoned.

[51] Int. Cl.⁶ .............................. G02B 5/32; G03H 1/18; G03H 1/26
[52] U.S. Cl. ..................... 359/7; 359/1; 359/15; 359/350
[58] Field of Search .................... 359/1, 3, 4, 6, 7, 9, 10, 15, 350, 355, 359, 361

[56] References Cited

U.S. PATENT DOCUMENTS

| | | | |
|---|---|---|---|
| 3,383,664 | 5/1968 | Chen et al. | 365/121 |
| 3,512,879 | 5/1970 | Reynolds et al. | 365/94 |
| 3,544,189 | 12/1970 | Chen et al. | 359/4 |
| 3,627,400 | 12/1971 | Caulfield | 359/25 |
| 3,703,328 | 11/1972 | Glass et al. | 359/7 |
| 3,773,400 | 11/1973 | Amodei et al. | 359/7 |
| 3,799,642 | 3/1974 | Phillips et al. | 359/7 |
| 3,873,179 | 3/1975 | Burke | 359/7 |
| 3,912,391 | 10/1975 | Fleisher et al. | 355/54 |
| 3,915,549 | 10/1975 | Amodei et al. | 359/7 |
| 3,932,299 | 1/1976 | Phillips | 252/300 |
| 3,933,504 | 1/1976 | Phillips et al. | 96/88 |
| 3,997,350 | 12/1976 | Ikeo | 96/88 |
| 4,052,119 | 10/1977 | Williams et al. | 359/7 |
| 4,062,618 | 12/1977 | Steensma | 359/11 |
| 4,094,575 | 6/1978 | Kellie | 359/10 |
| 4,111,524 | 9/1978 | Tomlinson, III | 385/37 |

(List continued on next page.)

FOREIGN PATENT DOCUMENTS

| | | |
|---|---|---|
| 0001714 | 5/1979 | European Pat. Off. . |
| 0284908 | 10/1988 | European Pat. Off. . |
| 2226127 | 6/1990 | United Kingdom . |

OTHER PUBLICATIONS

WO,A, 93/11589, PCT Publication (Honeywell Inc.), Jun. 10, 1993.
Patent Abstracts of Japan, vol. 9, No. 113, (P356) May 17, 1985 & JP,A,60 000 424, (Kitagawa Shiyunji) Jan. 5, 1985.
Applied Spectroscopy, vol. 39, No. 4, 1985, Baltimore US, pp. 582–586, W. B. Whitten et al., "Molecular Spectrometry with a Holographically Scanned CW Dye Laser and Supersonic Cooling".

(List continued on next page.)

*Primary Examiner*—William L. Sikes
*Assistant Examiner*—David R. Parsons
*Attorney, Agent, or Firm*—Merchant, Gould, Smith, Edell, Welter & Schmidt

[57] ABSTRACT

A method of writing plane holographic gratings Bragg-matched for reflection in the infrared in a photorefractive material using shorter wavelength light through a face perpendicular to the grating planes. The writing beam wavelength is selected to be within the photorefractive sensitivity range of the crystal and the angles are chosen relative to the wavelength to define a reflection grating with a period such that counter-propagating reflection occurs at the desired IR wavelength. For reflection gratings at different wavelengths, either the transmission or the reflection mode geometry may be used. In the transmission mode, the writing beams are incident on the same side face while in the reflection made the writing is on opposite faces in an off-axis (non-counter-propagating) configuration. Anti-reflection coatings of the appropriate wavelengths are used on the crystal surfaces to reduce reflection losses and improve the diffraction efficiency of the grating.

27 Claims, 4 Drawing Sheets

U.S. PATENT DOCUMENTS

| | | | |
|---|---|---|---|
| 4,153,330 | 5/1979 | Tomlinson, III | 385/35 |
| 4,198,117 | 4/1980 | Kobayashi | 385/37 |
| 4,336,976 | 6/1982 | Rodemann et al. | 359/22 |
| 4,362,359 | 12/1982 | Dammann et al. | 385/37 |
| 4,420,217 | 12/1983 | Gerharz | 359/4 |
| 4,420,829 | 12/1983 | Carlson | 369/103 |
| 4,449,785 | 5/1984 | Huignard et al. | 359/3 |
| 4,452,533 | 6/1984 | Miles et al. | 356/352 |
| 4,522,462 | 6/1985 | Large et al. | 385/37 |
| 4,615,034 | 9/1986 | von Gunten et al. | 372/99 |
| 4,643,519 | 2/1987 | Bussard et al. | 385/37 |
| 4,669,811 | 6/1987 | McQuoid et al. | 359/15 |
| 4,671,603 | 6/1987 | McQuoid et al. | 359/15 |
| 4,726,655 | 2/1988 | Mahlein | 359/588 |
| 4,759,596 | 4/1988 | Po et al. | 385/37 |
| 4,770,496 | 9/1988 | Mahlein | 359/588 |
| 4,773,063 | 9/1988 | Hunsperger et al. | 370/3 |
| 4,805,185 | 2/1989 | Smith | 372/97 |
| 4,810,047 | 3/1989 | Pernick | 359/19 |
| 4,824,193 | 4/1989 | Maeda et al. | 359/34 |
| 4,840,456 | 6/1989 | Fye | 372/97 |
| 4,879,167 | 11/1989 | Chang | 428/215 |
| 4,907,237 | 3/1990 | Dahmani et al. | 372/32 |
| 4,919,532 | 4/1990 | Mocker et al. | 356/28.5 |
| 4,923,270 | 5/1990 | Carter | 359/127 |
| 4,926,412 | 5/1990 | Jannson et al. | 370/3 |
| 4,927,220 | 5/1990 | Hesselink et al. | 359/7 |
| 4,965,152 | 10/1990 | Keys et al. | 430/1 |
| 5,026,131 | 6/1991 | Jannson et al. | 359/15 |
| 5,042,042 | 8/2091 | Hori et al. | 372/32 |
| 5,082,337 | 1/1992 | Chern et al. | 359/15 |
| 5,107,359 | 4/1992 | Ohuchida | 359/124 |
| 5,119,454 | 6/1992 | McMahon | 385/49 |

OTHER PUBLICATIONS

Patent Abstracts of Japan, vol. 11, No. 171 (E–512) (2618) Jun. 2, 1987 & JP, A, 62,005 677 (Matsushita) 12 Jan. 1987.

*Electronics Letters,* vol. 21, No. 20, Sep. 26, 1985, Enage GB, pp. 885–886, P. Mills et al., "Holographically Formed, Highly Selective, Infra-red Filter in Iron–Doped Lithium Niobate".

*RCA Review,* vol. 33, Mar. 1972, Princeton US, pp. 71–93, J. J. Amodei et al., "Holographic Recording in Lithium Niobate".

*Optics Letters,* vol. 16, No. 19, Oct. 1991, Washington US, pp. 1481–1483, Henri Rajbenbach et al., "Low–Noise Amplification of Ultraweak Optical Wave Fronts in Photorefractive Bi12Si020".

*Electronics Letter,* vol. 21, No. 15, Jul. 18, 1985, Enage GB, pp. 648–649, P. Mills et al. "Single–Mode Operation of 1.55 um Semiconductor Lasers Using a Volume Holographic Grating".

*Journal of Applied Physics,* vol. 47, No. 12, Dec. 1976, New York US, pp. 5421–5431, Rajiv R. Shah et al., "Characterization of Iron–Doped Lithium Niobate for Holographic Storage Applications".

*Topics In Applied Physics,* vol. 20, 1977, Berlin, H. M. Smith, pp. 10–20, "Holographic Recording Materials".

*Optics Communications,* vol. 29, No. 1, Apr. 1979, Amsterdam NL, pp. 44–47, M. P. Petrov et al., "Light Diffraction From the Volume Holograms in Electrooptic Birefringent Crystals".

Ning, Xiaohui, "Analysis of multiplexed-reflection holographic gratings,"*Journal of the Optical Society of America,* vol. 7, No. 8, Aug. 1990, pp. 1436–1440.

David M. Pepper et al., "The Photorefractive Effect," *Scientific American,* Oct. 1990.

Vladimirtsev et al., "Optical Damage in Transition Metal Doped Ferroelectric," *Ferroelectrics,* vol. 22, 1978, pp. 653–654.

A. M. Glass, "The Photorefrative Effect," *Optical Engineering,* vol. 17, No. 5, p. 470 ((Sep.–Oct. 1978).

Meyer et al., "Kinetics of Fixation of Phase Holograms in LiNbo$_3$, " *Phys. Stat. Sol.,* (a) vol. 53, p. 171 (1979).

Hertel et al., "Theory of Thermal Hologram Fixing and Application to LiNbO$_8$:Cu$^2$:" *Phys. Stat. Sol.* (a) vol. 104, p. 844, (1987).

W. Phillips et al., "Optical and Holographic Storage Properties of Transition Metal Doped Lithium Niobate," *RCA Review,* vol. 33, p. 94, (Mar. 1972).

Staebler et al., "Multiple Storage and Erasure of Fixed Holograms in Fe–doped LiNbO$_3$, " *Applied Physics Letters,* vol. 26, No. 4, p. 182 (Feb. 15, 1975).

Staebler et al., "Thermally Fixed Holgrams in LiNbO$_3$," *Ferroelectrics,* vol. 3, p. 107 (1972).

Staebler et al., "Thermally Fixed Holograms in LiNbO$_3$, " *Ferroelectrics,* vol. 3, p. 107 (1972).

Amodei et al., "Holographic Pattern Fixing in Electro–Optic Crystals," *Applied Physics Letters,* vol. 18, No. 12, p. 540, (Jun. 15, 1971).

K. Blotekjaer, "Limitations on Holographic Storage Capacity of Photo–chromic and Photoreractive Media," *Applied Optics,* vol. 18, No. 1, p. 57 (Jan. 1, 1979).

W, V. Smith, "Large Capacity Holographic Memory," *IBM Tecchnical Disclosure Bulletin,* vol. 15, No. 3, Aug. 1972.

Thomas Stone and Nicholas George, "Hybrid Diffractive–Refractive Lenses and Achromats," *Applied Optics,* vol. 27, No. 14, Jul. 15, 1988.

N. V. Kukhtarev et al., "Holographic Storage in Electrooptic Crystals, I. Steady State," *Ferroelectrics,* vol. 22, pp. 949–960, 1979.

Tom Parish, "Crystal Clear Storage," *BYTE,* p. 283, Nov. 1990.

S. W. McCahon et al., "Hologram Fixing in Bi$_{12}$TIO$_{20}$ Using Heating and an AC Electric Field," *Applied Optics,* vol. 28, No. 11, Jun. 1, 1989.

G. D. Stucky et al., "Quantum Confinement and Host/Guest Chemistry: Probing a New Dimension," *Articles,* Feb. 9, 1990.

J. F. Scott et al., "Ferroelectric Memories," *Science,* vol. 246, p. 1400.

B. I. Greene, "All–Optical nonlinearities in Organics," *Articles,* Feb. 9, 1990.

C. Gu et al., "Diffraction Properties of Fixed Gratings in Photorefractive Media," *Journal of the Optical Society of America B: Optical Physics,* vol. 7, No. 12, Dec. 1990, pp. 2339–2346.

S. Wu et al., "Reconfigurable Interconnections Using Photorefractive Holograms," Applied Optics, vol. 29, No. 8, Mar. 10, 1990, pp. 1118–1125.

Amnon Yariv et al., "High Resolution Volume Holography using Orthogonal Data Storage," *OSA Topical Meeting on Photorefractive Materials,* Jul. 1991, pp. 130–132.

D. W. Woodbury et al., "Hologram Indexing in LiNbo$_3$ With A Tunable Pulsed Laser Source, " *Applied Optics,* vol. 18, No. 15, Aug. 1, 1979, pp. 2555–2558.

W. J. Burke et al., "Volume Phase Holographic Storage in Ferroelectric Crystals," *Optical Engineering,* vol. 17, No. 4, Jul.–Aug. 1978, pp. 308–316.

METHODS AND DEVICES FOR USING PHOTOREFRACTIVE MATERIALS AT INFRARED WAVELENGTHS

CROSS-REFERENCE TO RELATED APPLICATIONS

This is a continuation-in-part of application Ser. No. 07/965,746, entitled "Fixing Method for Narrow Bandwidth Volume Holograms in Photorefractive Materials," filed Oct. 23, 1992, now U.S. Pat. No. 5,335,098, issued Aug. 2, 1994, by V. Leyva and G. A. Rakuljic, which is a continuation-in-part of application Ser. No. 07/908,298, entitled "Photorefractive Systems and Methods," filed Jul. 2, 1992, by G. A. Rakuljic and A. Yariv, which is a continuation-in-part of application Ser. No. 07/736,736, entitled "Photorefractive Systems and Methods," filed Jul. 26, 1991 by G. A. Rakuljic and A. Yariv, now abandoned all of which applications are incorporated by reference herein.

BACKGROUND OF THE INVENTION

1. Field of the Invention

The present invention relates to methods and devices providing holographic gratings which reflect at infrared wavelengths in photorefractive materials such as lithium niobate ($LiNbO_3$). Materials such as $LiNbO_3$ have little or no photorefractive sensitivity in the infrared (IR), which rules out direct writing of holographic gratings using infrared wavelengths. However, there are many potential applications for holographic optical elements such as filters and wavelength-selective mirrors at these wavelengths. Some of these applications include narrowband IR imaging filters, holographic reflectors for external cavity lasers, holographic multiplexers and demultiplexers for wavelength division multiplexing (WDM) communication systems, and wavelength-selective elements for optical spectrum analyzers and tuners. This is desirable to provide photorefractive devices which can store, filter or modify signals at infrared wavelengths.

2. Description of Related Art

As referenced in the patent applications cited above, photorefractive materials have been known to be effective media for storing volume holographic gratings. One application of this technology is extremely narrow bandwidth reflection filters using volume holographic gratings recorded in these materials. Holographic grating filters with 0.12 Å fabricated at 6562.8 Å (the solar $H_\alpha$ absorption wavelength) Full Width at Half Maximum (FWHM) bandwidths have been using this technology as described in the parent patent applications, supra. Similar filters, particularly those with their center wavelengths in the IR band, have been proposed to characterize and control the output wavelengths of semiconductor lasers for optical telecommunications applications.

In addition to their narrow bandwidth properties, holographic gratings written in some photorefractive materials, such as $LiNbO_3$, have the additional feature of being convertible to permanent, i.e., fixed, gratings that are not erased by illumination (J. J. Amodei and D. L. Staebler, "Holographic recording in lithium niobate," RCA Review vol. 33, pp. 71–94 (1972)). Through an enhanced fixing method described in the parent patent applications, Supra, high fixed diffraction efficiencies are obtained for holographic gratings in $LiNbO_3$, making devices using these gratings feasible for commercial applications.

However, many photorefractive materials such as $LiNbO_3$ have little or no photosensitivity at wavelengths greater than about 700 nm, although most optical telecommunications systems operate well above this range. Infrared wavelength bands centered around 1.31 μm and 1.55 μm are employed very widely in optical telecommunication applications because they are within the transmission windows of optical fibers and the gain windows of optical amplifiers. Holographic gratings at these wavelength bands can provide essential elements for components such as accurate wavelength lasers, narrow bandwidth filters, and optical tuners for telecommunications systems. In addition, holographic gratings that are reflective in the IR can be important for such applications as optical spectrum analyzers for testing telecommunications components and systems, spectroscopy, and remote sensing in the infrared band.

SUMMARY OF THE INVENTION

To overcome the limitations in the prior art described above, and to overcome other limitations that will become apparent upon reading and understanding the present specification, the present invention discloses a method of writing plane, volume holographic gratings Bragg-matched for reflection in the infrared at the desired incidence angle in a photorefractive material using shorter wavelength light in transmission mode through one or more faces in the material perpendicular to the grating planes. The wavelength of the interfering beams is selected to be within the photorefractive sensitivity range of the crystal and to obtain a Bragg condition solution for a reflection grating with a period such that counter-propagating reflection occurs at the desired IR wavelength. The angle and wavelength of the writing beams are controlled to obtain the desired grating spacing inside the crystal for reflection at the correct incidence angle and IR wavelength. Alternatively, for reflection gratings at shorter wavelengths, the reflection mode geometry is used, but with the writing beams being in a non-counter-propagating configuration. Anti-reflection coatings of the appropriate wavelengths are used on the crystal surfaces to reduce reflection losses and improve the diffraction efficiency of the grating.

A holographic grating mirror with normal incidence reflection at 1.31 μm is fabricated, in one example, by writing a plane wave hologram in a $LiNbO_3$ crystal using 488 nm beams from an Ar-ion laser incident on one side of the crystal with an approximately 112° included angle. The wavelength of reflection is monitored and the spectral response is characterized using a temperature-tuned distributed feedback laser. Special care is taken to write the grating to saturation while avoiding beam coupling and shadowing effects to obtain the largest possible diffraction efficiency.

Devices in accordance with the invention may comprise reflectors selectively effective at chosen wavelengths within the much used IR band. Preferably the grating planes are substantially normal to the C-axis of the photorefractive material and the readout beam surfaces of the crystal have an anti-reflection coating at the readout beam wavelength.

A fixed reflectivity of 35% with approximately 1 Å Full Width at Half Maximum (FWHM) bandwidth has been measured in an infrared holographic mirror prepared as described above in a 1 $cm^3$ crystal. A narrower bandwidth mirror, with 0.38 Å FWHM bandwidth, can also be fabricated using a crystal with lighter doping, but with a lower (about 4.5%) peak diffraction efficiency.

BRIEF DESCRIPTION OF THE DRAWINGS

A better understanding of the invention may be obtained by reference to the following detailed description in conjunction with the attached drawings, where.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Figure 1:
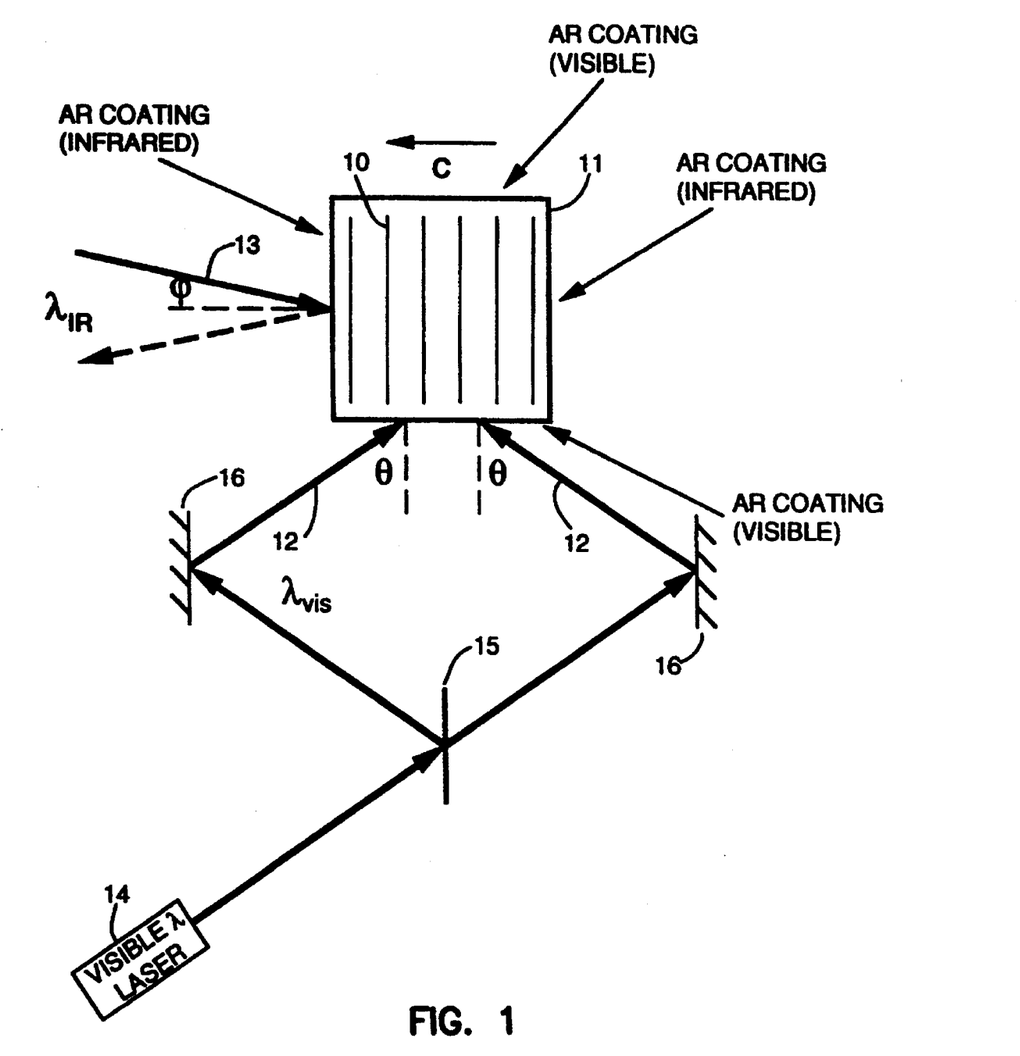
FIG. 1 is a schematic diagram of an infrared filter device and a method used to write reflection gratings in a photorefractive crystal for the infrared using visible wavelength light from the side.

FIG. 1 shows one example of a method for writing plane wave volume holographic gratings 10 that are Bragg-matched for reflection at infrared wavelengths outside the photorefractive sensitivity range of the host material 11. In this embodiment, the host material 11 is a LiNbO$_3$ crystal, although those skilled in the art will recognize that other materials could also be used. In this example, the crystal 11 is illuminated by two visible wavelength plane writing beams 12 in a transmission mode geometry through a side face parallel to the crystal's 11 c-axis, so the resulting grating 10 period inside the crystal 11 is matched for reflection of readout beams 13 in the infrared (IR) at the desired incidence angle. The bisector of the full angle between the writing beams 12 is perpendicular to the incidence surface so the grating 10 wavevector is parallel to the c-axis of the crystal 11 to maximize the magnitude of the grating generated through the photorefractive effect. The crystal 11 is anti-reflection (AR) coated for the IR wavelength on the c-axis face and for the visible writing beam 12 wavelength on the side a-faces. The term "a-face" is used in the same sense as normally employed in crystallography.

In the configuration shown in FIG. 1, where the writing beams 12 are incident through one side face, the wavelength and incidence angle solution for the desired IR wavelength is given by the Bragg condition:

$$\sin\theta = \frac{\lambda_w}{\lambda_r} \sqrt{n_r^2 - \sin^2\phi} \qquad (1)$$

where $\Theta$ is the angle of incidence of the writing beams 12 (measured outside the crystal 11), $\phi$ is the angle of incidence of the reflected beam 13 relative to the normal to the plane of the gratings, $n_r$ is the index of refraction of the crystal 11 at $\lambda_r$, $\lambda_w$ is the wavelength of the writing beams 12, and $\lambda_r$ is the wavelength of the retro-reflected beam 13. Plane waves at the precise writing wavelength and incidence angle are used to record the gratings 10 in the crystal 11. For example, to write gratings 10 for retro-reflection at 1.31 µm in a LiNbO$_3$ crystal 11 ($n_r$=2.2), the incidence angle for the writing plane waves at 488 nm entering the side faces of the crystal 11 is 56°. In principle, by varying $\Theta$ from 0° to 90° and using writing beam wavelengths down to 350 nm, any $\lambda_r$ greater than 770 nm can be obtained. During the writing step, the wavelength of the reflection readout beam 13 is monitored. A distributed feedback laser is used as a tunable source in measuring the reflection energy at different wavelengths. The writing beams 12 are adjusted until the desired IR reflection wavelength is obtained. The writing beams 12 are generated by a visible wavelength laser 14, such as an Ar-ion laser, beamsplitter 15, and mirrors 16. Once written, the grating 10 is then fixed and developed to render it insensitive to illumination by using the processes described in the parent patent applications, supra.

The wavelength of reflection is specified by varying either the angle of incidence of the writing beam 12, or its wavelength, or both. The sensitivity of the reflection wavelength to either writing beam 12 wavelength or angle for $\phi=0$ (normal incidence reflection) is given by:

$$\Delta\Theta = \frac{n_r \lambda_w}{\lambda_r \sqrt{\lambda_r^2 - (n_r \lambda_w)^2}} \Delta\lambda_r \qquad (2a)$$

$$\Delta\lambda_w = \frac{\lambda_w}{\lambda_r} \Delta\lambda_r \qquad (2b)$$

Therefore, for a 0.5 Å filter at 1.31 µm center wavelength, the angular tolerance $\Delta\Theta$ is 0.20 arc-seconds, while the wavelength tolerance $\Delta\lambda_w$ is 0.2 Å. Adjusting the incidence angles for the writing beams 12 to this level of precision presents significant technical challenges, while the wavelength tolerance is well within the tuning capability of a single-frequency dye laser 14. This indicates that in order to fabricate a mirror at a specific wavelength, the preferred method is to fine-tune the readout beam 13 wavelength by varying the writing beam 12 wavelength, leaving the incidence angle fixed. This is done using a variable wavelength laser, such as a frequency-stabilized dye laser, as the source 14.

Figure 2:
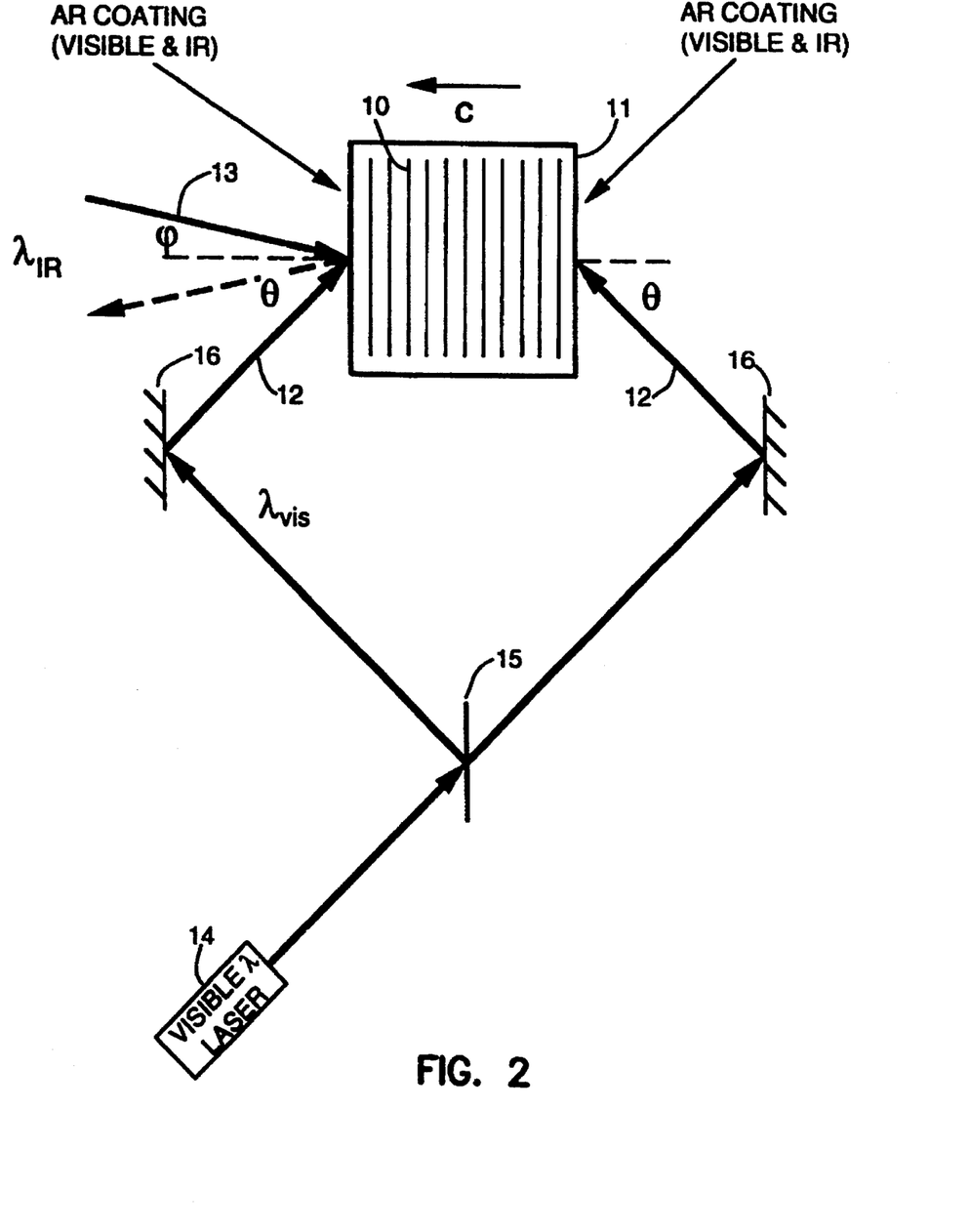
FIG. 2 is a schematic diagram of another infrared filter device and a method for writing shorter wavelength infrared reflection gratings using visible light in an off-axis reflection mode geometry.

For shorter wavelength IR mirrors, or for longer wavelength writing beams 12, the configuration of FIG. 1 ultimately reaches the limit of $\Theta=90°$, as shown by Eqn. (1). At this point the readout beam 13 wavelength $\lambda_r=\lambda_w \sqrt{n_r^2-\sin^2\phi}$, which represents the smallest grating 10 period that can be obtained in the transmission mode geometry because of refraction. For smaller $\lambda_r/\lambda_w$ ratios, the grating 10 is written using the reflection mode geometry, but with the beams 12 off-axis, i.e., non-counter propagating as shown in FIG. 2. For this geometry, the c-axis faces of the crystal 11 are AR coated for both the IR and visible writing beam wavelengths using a multi-layer coating process to reduce reflection losses. In this configuration, the angle of incidence $\Theta$ of the writing beams 12 as a function of the wavelength ratio of the writing and readout beams 13 and desired angle of reflection $\phi$ is given by:

$$\sin\theta = n_w \sqrt{1 - \left(\frac{\lambda_w n_r}{\lambda_r n_w}\right)^2 \left(1 - \frac{\sin^2\phi}{n_r^2}\right)} \qquad (3)$$

wherein $n_w$ is an index of refraction at a wavelength $\lambda_w$ with the range of allowed readout beam 13 to writing beam 12 wavelength ratios being given by:

$$1 \leq \frac{\lambda_r}{\lambda_w} < \frac{n_r}{\sqrt{n_w^2 - 1}} \qquad (4)$$

for the φ=0 (normal incidence reflection) case. Note that, using the $$\frac{\lambda_r}{\lambda_w}$$

ratio alone, there still exists a range of readout beam 13 to writing beam 12 wavelength ratios for which there is no solution. For LiNbO₃, using the approximation $n_r \approx n_w \approx 2.2$, this range is $1.12 < \lambda_r/\lambda_w < 2.2$. However, using the full 350 to 700 nm photorefractive sensitivity range for the writing beam 12 in a LiNbO₃ crystal 11, IR reflection gratings at any desired wavelength can be written. In addition, other techniques such as using specially cut (non-cubic) crystals 11 and immersing the crystal 11 in an index matching media to reduce writing beam 12 refraction can be used to overcome physical limitations of using large writing beam incidence angles.

A high reflectivity, 1 Å bandwidth infrared holographic mirror with normal incidence gratings written in a photorefractive material as set forth in the present invention is shown in FIG. 1. The photorefractive material is a 0.05% Fe-doped LiNbO₃ crystal 11, which has a photorefractive sensitivity range of about 350 nm to 700 nm. The LiNbO₃ crystal is 1 cm on each side with anti-reflection coatings on its faces. One or more holographic gratings 10 are stored in the crystal 11 with planes normal to the c-axis of the crystal. The gratings are written to saturation using a 488 nm beam from an Ar-ion laser incident on the side faces of the crystal at exactly 56°. The gratings are written for approximately 15 minutes, for a total exposure of approximately 350 J/cm². Special care is taken to write the gratings to saturation while minimizing beam coupling and shadowing effects to obtain the largest possible diffraction efficiency. Beam coupling is minimized by limiting the exposure time; if shadowing effects present a problem, then a longer crystal can be used.

A temperature-tuned distributed feedback (DFB) laser is used to scan over its wavelength range in order to characterize the spectrum, i.e., measure the reflectivity, of the gratings, and the writing beam incidence angles are adjusted and the gratings rewritten until the desired reflection wavelength is obtained. Preferably, the gratings are reflective to an incident beam parallel to the c-axis of the crystal at a wavelength in the 1310 nm range.

Figure 3:
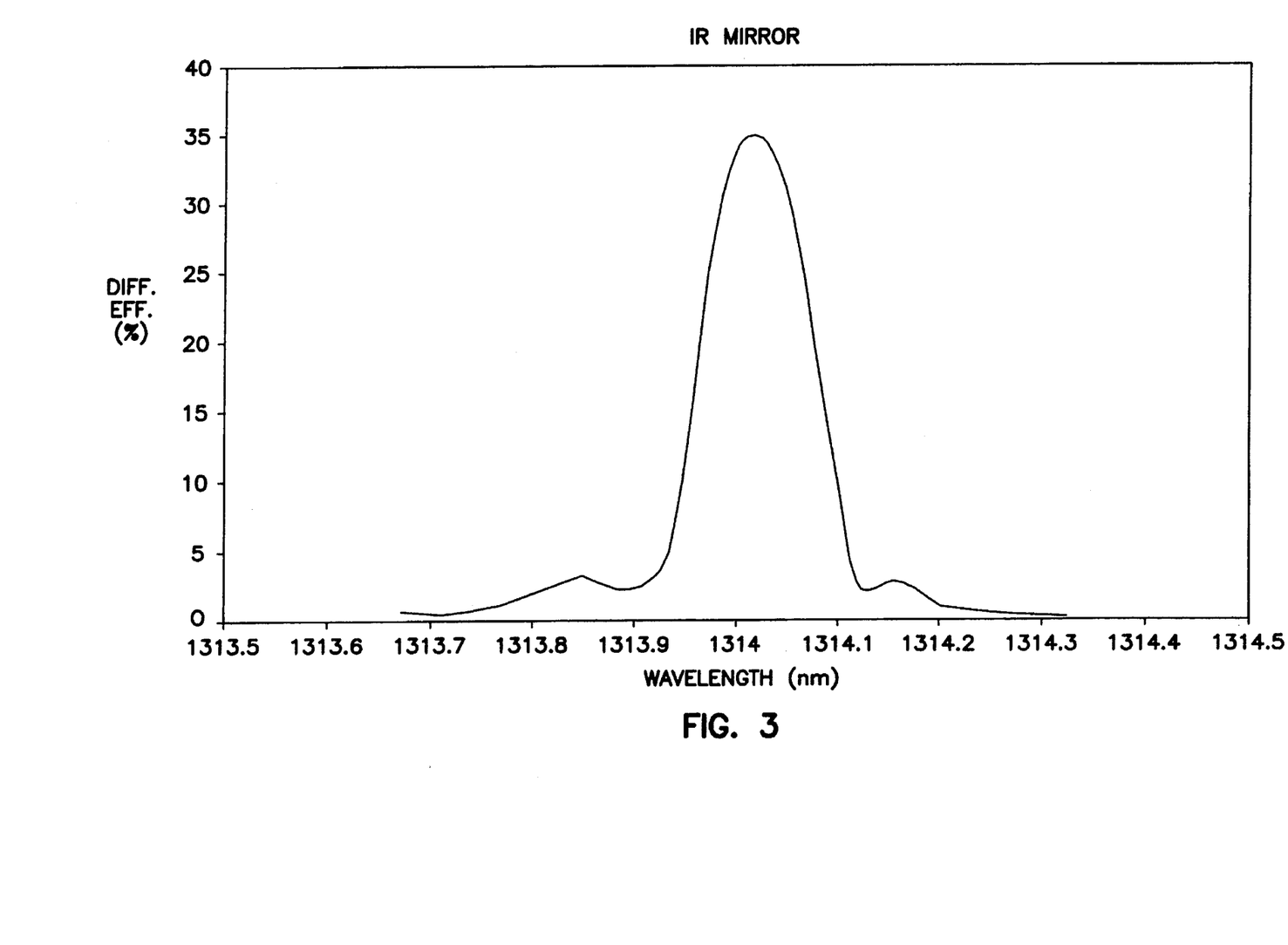
FIG. 3 is a spectral graph of a high reflectivity, 1 Å bandwidth infrared holographic mirror with normal incidence gratings written in a photorefractive crystal as set forth in the present invention.

FIG. 3 is a spectral graph of the device shown in FIG. 1. The graph data show a 35% reflectivity at its peak with a FWHM bandwidth of approximately 1 Å. Because of shadowing effects from the edges of the cube and photorefractive beam coupling, the effective grating length is less than the full thickness of the crystal, resulting in a wider bandwidth gratings than would be expected from theory.

Figure 4:
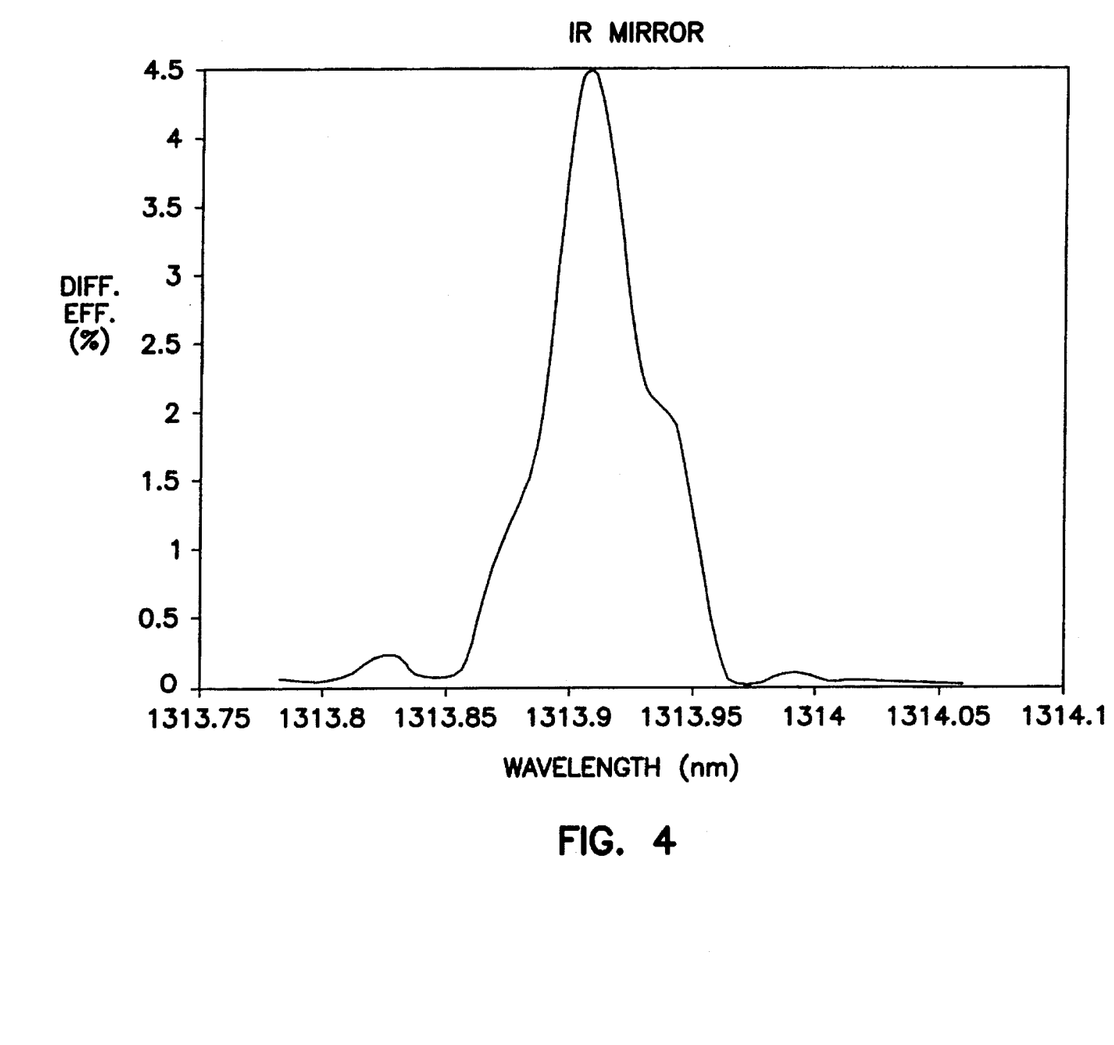
FIG. 4 is the spectral graph of a 0.38 Å bandwidth infrared mirror with holographic gratings written in a photorefractive crystal as set forth in this invention.

FIG. 4 is the spectral graph of a 0.38 Å bandwidth infrared mirror with holographic gratings written in a 1 cm³ photorefractive crystal as set forth in this invention. The total exposure for these gratings is approximately 470 J/cm² at 488 nm. A sub-Angstrom grating bandwidth of 0.38 Å is obtained for this mirror, which is close to the theoretical bandwidths of 0.37 Å for a 1 cm thick grating at 1.31 μm. The theoretical bandwidth of volume holographic gratings is given by:

$$\Delta\lambda = \frac{\lambda_r^2}{2 n_r l} \qquad (5)$$

at normal incidence reflection, where l is the thickness of the gratings, $n_r$ is the index of refraction at $\lambda_r$, and $\lambda_r$ is the wavelength of retro-reflection. This indicates that the gratings extend essentially through the entire thickness of the crystal, resulting in its narrower bandwidth over the previous example. The measured peak reflectivity of this IR mirror is about 4.5%.

The recorded holograms can contain holographic images if desired. An image beam may even be modulated with data, although the relatively long IR wavelengths do not permit the most efficient usage of the medium.

These IR holographic reflection gratings have applications in filters, wavelength-selective mirrors, tuners for spectrum analyzers and wavelength division multiplexed (WDM) communications systems, and data storage devices. External cavity lasers using volume hologram retro-reflection gratings and wavelength-stabilized DFB lasers using holographic filters can be used as extremely accurate, single mode sources for WDM fiber-optic communication systems as described in the parent patent applications, supra. Holographic gratings in the IR also have application as wavelength selective elements for tuners and spectrum analyzers for these wavelength bands.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of writing holographic gratings in a photorefractive crystal to reflect in a wavelength band which is a longer wavelength than a photorefractive response band of the crystal, the crystal having a c-axis and sides orthogonal and parallel thereto, comprising the steps of:

directing a first coherent beam onto the crystal at an acute incidence angle to a first side thereof, the first side being substantially parallel to the c-axis of the crystal, the reference beam having a first wavelength within the photorefractive response band of the crystal;

directing a second coherent beam at the first wavelength onto the crystal on the first side thereof and at an acute incidence angle to define with the first beam an interference grating within the crystal, such that the grating is reflective to wave energy directed onto a side of the crystal substantially normal to the C-axis at a wavelength greater than a photorefractive response band of the crystal.

2. The method as set forth in claim 1 above, wherein the crystal is 0.05% Fe-doped LiNbO₃ and has a photorefractive response band of about 350 nm to 700 nm.

3. The method as set forth in claim 1 above, wherein the grating is reflective at a wavelength greater than 770 nm.

4. The method as set forth in claim 1 above, wherein the grating is reflective at an approximately 1310 nm wavelength.

5. The method of writing a reflective hologram in a photorefractive crystal, wherein the hologram is reflective to an incident beam at a reading side at a wavelength longer than a photorefractive sensitivity range of the crystal, comprising the steps of:

writing a plane holographic grating in the crystal, by illumination of the crystal with interfering beams at wavelengths lying in the photorefractive sensitivity range of the crystal, through at least one face substantially perpendicular to the holographic grating planes; and rendering the holographic grating substantially permanent.

6. The method as set forth in claim 5 above, wherein the crystal is substantially rectangular and has a c-axis, the illumination is through one or more sides substantially parallel to the c-axis, and the grating planes are substantially normal to the c-axis, and wherein writing beams are directed onto the crystal at angles $\Theta$ relative to the c-axis that vary in relation to the grating wavelength $\lambda_r$, the index of refraction $n_r$ of the crystal and the wavelength $\lambda_w$ of the incident beams.

7. The method as set forth in claim 6 above wherein the Bragg condition:

$$\sin\theta = \frac{\lambda_w}{\lambda_r} \sqrt{n_r^2 - \sin^2\phi}$$

is satisfied by choice of illumination angle and writing wavelengths, wherein $\phi$ is an angle of incidence of a reflected beam relative to the normal of holographic grating planes.

8. The method as set forth in claim 7 above, wherein the step of writing comprises directing the writing beams into the crystal at the same side, with the angle $\Theta$ being the angle between the incident beam and the plane of the gratings being formed, and the side being adjacent the reading side of the crystal.

9. The method as set forth in claim 6 above, wherein the step of writing comprises directing the writing beams into the crystal at opposite sides, one of which is the reading side of the crystal, and with the angle $\Theta$ is the angle between the beams and an axis orthogonal to the plane of the gratings.

10. The method as set forth in claim 9 above, wherein the Bragg condition is satisfied by:

$$\sin\theta = n_w\sqrt{1 - \left(\frac{\lambda_w n_r}{\lambda_r n_w}\right)^2 \left(1 - \frac{\sin^2\phi}{n_r^2}\right)}$$

by choice of illumination angle and writing wavelength, wherein $\phi$ is an angle of incidence of a reflected beam relative to the normal of the holographic grating planes and $n_w$ is an index of refraction at the wavelength $\lambda_w$ of the writing beams.

11. An electromagnetic wave reflector device comprising a photorefractive crystal having a photorefractive sensitivity range of about 350 nm to 700 nm and a c-axis, the crystal having a holographic grating therein with planes substantially normal to the c-axis of the crystal, the grating being reflective to an incident beam through a face substantially normal to the c-axis of the crystal at a wavelength greater than 770 nm.

12. A device as set forth in claim 11 above, wherein the crystal is 0.05% Fe-doped $LiNbO_3$ and has anti-reflection coating thereon, and wherein the grating is reflective to approximately 1310 nm wavelength incident beams.

13. A device as set forth in claim 12 above, wherein the grating is the product of Bragg condition matched interfering beams in the photorefractive sensitivity range of the crystal and has a bandwidth less than about 1 Å, and a reflectivity of greater than about 5%.

14. A device as set forth in claim 13 above, wherein the grating is permanently fixed in the crystal.

15. An electromagnetic wave reflector device comprising a photorefractive crystal having a photorefractive sensitivity in a first wavelength range, the crystal having a holographic grating therein which is reflective in a selected direction to incident beams in a wavelength range longer than the first range.

16. A method of writing reflection mode holographic gratings in a photorefractive material, comprising the steps of:

writing plane holographic gratings in the material Bragg-matched for reflection at a desired infrared wavelength at a specific incidence angle, using shorter wavelength writing beams through a face of the material perpendicular to the grating planes, wherein the writing beams' wavelength is selected to be within the photorefractive sensitivity range of the material and to obtain a Bragg condition solution for the desired infrared wavelength; and controlling the angle and wavelength of the writing beams to obtain a desired grating spacing inside the material for substantially normal incidence reflection at the desired infrared wavelength.

17. The method as set forth in claim 16 above, wherein the gratings are written for retro-reflection, at the desired infrared wavelength.

18. A method of writing reflection mode holographic gratings in a photorefractive material, comprising the steps of:

writing plane holographic gratings Bragg-matched for retro-reflection at a desired infrared wavelength in the material using shorter wavelength writing beams in reflection mode, wherein the writing beams' wavelength is selected to be within the photorefractive sensitivity range of the material and to obtain a Bragg condition solution for the desired infrared wavelength; and controlling the angle and wavelength of the writing beams to obtain a desired grating spacing inside the material for normal incidence reflection at the desired infrared wavelength.

19. The method as set forth in claim 18 above, wherein the gratings are written for retro-reflection at the desired infrared wavelength.

20. A method for writing volume holographic gratings Bragg-matched for reflection at infrared wavelengths outside the photorefractive sensitivity range of a host material, comprising the steps of:

illuminating the material using one or more visible wavelength plane writing beams incident upon side faces of the material parallel to the material's c-axis, so that a resulting grating period inside the material is matched for reflection at a desired infrared wavelength and incidence angle; and coating the material with an anti-reflection layer for the infrared wavelength on a c-axis face of the material and for the visible writing beam wavelength on the side faces of the material.

21. The invention as set forth in claim 20, wherein the writing beams are incident through the side faces of the material, and further, wherein the wavelength and incidence angle solution for the desired infrared wavelength is given by the Bragg condition:

$$\sin\theta = \frac{n_r \lambda_w}{\lambda_r}$$

where $\Theta$ is an angle of the writing beams measured outside the material relative to the normal of illuminated surface of the material, $n_r$ is an index of refraction of the material, $\lambda_w$ is the writing beams' wavelength, and $\lambda_r$ is the desired infrared wavelength.

22. The invention as set forth in claim 20, wherein the illuminating step further comprises monitoring a reflection's wavelength using a variable wavelength laser, and adjusting the writing beams until a desired infrared wavelength is obtained.

23. The invention as set forth in claim 20, wherein the laser is a temperature-tuned distributed feedback (DFB) laser.

24. The invention as set forth in claim 20, further comprising the step of fixing the grating to render it insensitive to illumination.

25. The invention as set forth in claim 20, wherein the wavelength of normal incidence reflection is specified by varying the angle of incidence of the writing beams.

26. The invention as set forth in claim 20, wherein the wavelength of normal incidence reflection is specified by varying the wavelength of the writing beams.

27. The invention as set forth in claim 20, wherein the wavelength of normal incidence reflection is specified by varying both the angle of incidence of the writing beam and the wavelength of the writing beam.

* * * * *

UNITED STATES PATENT AND TRADEMARK OFFICE
CERTIFICATE OF CORRECTION

PATENT NO. : 5,491,570

DATED : February 13, 1996

INVENTOR(S) : George A. Rakuljic, et al.

It is certified that error appears in the above-identified patent and that said Letters Patent is hereby corrected as shown below:

In column 1, line 49, please insert --Full Width at Half Maximum (FWHM) bandwidths have been-- after the numeral "0.12 Å;

In column 1, line 50, please delete "Full Width at Half Maximum (FWHM) bandwidths have been" after the word "wavelength)".

Signed and Sealed this

Twenty-third Day of July, 1996

Attest:

BRUCE LEHMAN

*Attesting Officer*     *Commissioner of Patents and Trademarks*